United States Patent [19]

Logie

[11] Patent Number: 4,924,278

[45] Date of Patent: May 8, 1990

[54] EEPROM USING A MERGED SOURCE AND CONTROL GATE

[75] Inventor: Stewart Logie, Palo Alto, Calif.

[73] Assignee: Advanced Micro Devices, Inc., Sunnyvale, Calif.

[21] Appl. No.: 274,633

[22] Filed: Nov. 15, 1988

Related U.S. Application Data

[63] Continuation of Ser. No. 65,040, Jun. 19, 1987, abandoned.

[51] Int. Cl.$^5$ ............... H01L 29/78; H01L 27/02; H01L 29/34
[52] U.S. Cl. ............... 357/23.5; 357/23.6; 357/23.11; 357/41; 357/54
[58] Field of Search ............... 357/23.6, 23.5, 23.11, 357/41, 54; 365/185

[56] References Cited

U.S. PATENT DOCUMENTS

| | | | |
|---|---|---|---|
| 4,019,197 | 4/1977 | Lohstroh et al. | 357/23.5 |
| 4,037,242 | 7/1977 | Gosney | 357/23.5 |
| 4,288,863 | 9/1981 | Adam | 357/23.5 |
| 4,377,857 | 3/1983 | Tickle . | |
| 4,404,577 | 9/1983 | Cranford, Jr. et al. | 357/23.5 |
| 4,425,631 | 1/1984 | Adam | 357/23.5 |
| 4,599,706 | 7/1986 | Guterman . | |
| 4,616,245 | 10/1986 | Topich et al. | 357/23.5 |
| 4,663,740 | 5/1987 | Ebel | 357/23.5 |
| 4,686,558 | 8/1987 | Adam | 357/23.5 |

FOREIGN PATENT DOCUMENTS

| | | | |
|---|---|---|---|
| 57-18367 | 1/1982 | Japan | 357/23.5 |
| 59-125654 | 7/1984 | Japan | 357/23.6 |
| 60-45067 | 3/1985 | Japan | 357/23.5 |

OTHER PUBLICATIONS

Roger Cuppens et al., "An EEPROM for Microprocessors and Custom Logic", IEEE Journal of Solid-State Circuits, vol. SC-20, No. 2, Apr. 1985, 603-608.

Jun-Ichi Miyamoto et al., "An Experimental 5-V-Only 256-kbit CMOS EEPROM with a High-Performance Single-Polysilicon Cell", IEEE Journal of Solid-State Circuits, vol. SC-21, No. 5, Oct. 1986, pp. 852-859.

Primary Examiner—Andrew J. James
Assistant Examiner—Ngan Van Ngo
Attorney, Agent, or Firm—Skjerven, Morrill, MacPherson, Franklin & Friel

[57] ABSTRACT

A single layer of polycrystalline silicon (poly-Si) is used in an EEPROM structure, which obviates the need to form a separate control gate and floating gate. The EEPROM utilizes three separate NMOS transistors: a write transistor, a read transistor, and a sense transistor. A thin tunnel oxide layer separates the N+ source region of the write transistor from an N doped poly-Si layer and capacitively couples the source region to the poly-Si layer. The poly-Si layer extends over the N+ source region of the sense transistor and is capacitively coupled to the source region of the sense transistor via a thin gate oxide insulating layer which is thicker than the oxide layer comprising the tunnel oxide layer. This poly-Si layer continues to extend over a channel region separating the N+ source and N+ drain regions of the sense transistor, the poly-Si layer being separated from the channel via the thin gate oxide insulating layer. The drain of the sense transistor also acts as the source of the read transistor. In the above structure, the poly-Si layer acts as the floating gate over the channel of the sense transistor. Since the poly-Si floating gate is both capacitively coupled to the source of the sense transistor and to the source of the write transistor, no separate control gate or control gate electrode is needed (the source of the sense transistor acts as the control gate). The structure, inter alia, enables a higher coupling ratio during erasing, thus allowing faster erase times by coupling a higher voltage onto the poly-Si floating gate.

8 Claims, 3 Drawing Sheets

EEPROM USING A MERGED SOURCE AND CONTROL GATE

This application is a continuation application Ser. No. 07/065,040, filed June 19, 1987 now abandoned.

BACKGROUND OF THE INVENTION

1. Field of the Invention

The present invention relates to electrically erasable programmable read only memory (EEPROM) devices and in particular to an improved EEPROM structure which requires less substrate surface area and is simpler to manufacture than prior art EEPROMs.

2. Description of the Prior Art

The most recent generation of memories is the EEPROM, which allows its programmed contents to be electrically erased, thereby allowing reprogramming. Unlike typical erasable programmable read only memories (EPROMs), which are usually erased in bulk by exposure to ultra-violet light, an EEPROM allows electrical erasure, typically within ten milliseconds.

A typical prior art EEPROM is described by Tickle, U.S. Pat. No. 4,377,857, issued Mar. 22, 1983. A typical prior art EEPROM memory cell is shown in FIG. 1a and includes transistor 100 having source 101 and drain 102 formed in silicon substrate 99, source 101 and drain 102 being of a conductivity type opposite to that of substrate 99, and having channel region 103 formed therebetween. Gate insulation 104 electrically insulates polycrystalline silicon floating gate 105 from channel 103 and drain 102. A very thin tunnel oxide region 106 electrically insulates a small portion of floating gate 105 from drain 102. This prior art structure further includes control gate 108, and insulation layer 107 formed between floating gate 105 and control gate 108.

Also shown in FIG. 1a are the various capacitances which inherently form in the cell: capacitance $C_{ch}$ is the capacitance formed between floating gate 105 and channel region 103; capacitance $C_{pp}$ is the capacitance formed between control gate 108 and floating gate 105; and capacitance $C_t$ is the capacitance formed between floating gate 105 and drain 102.

Shown in FIG. 1b is a schematic circuit diagram of a prior art EEPROM which uses transistor 100, shown in FIG. 1a, and word coupling transistor 200. Control gate (CG) 108, word line (WL) 205, bit line (BL) 210, connections to substrate 99, and source 101 and drain 102 of transistor 100 are shown. Word line 205 is connected to the control gate of transistor 200. Described below is the operation of such a prior art EEPROM.

Table 1 shows the various voltages applied to the circuit of FIG. 1b.

TABLE 1

|  | WL | BL | CG | Source | Substrate |
|---|---|---|---|---|---|
| Read | $V_{cc}$ | $V_{sense}$ | $V_r$ | ground | ground |
| Write | $V_{pp}$ | ground | $V_{pp}$ | ground | ground |
| Erase | $V_{pp}$ | $V_{pp}$ | ground | float | ground |

In order to store a logical 0 in the EEPROM, electrons are injected into floating gate 105 to provide a negative voltage on floating gate 105, thus increasing the control gate threshold voltage needed to turn on transistor 100. This injection of electrons on floating gate 105 is accomplished, for example, by Fowler-Nordheim tunneling. One technique to achieve this electron tunneling is to place high voltage $V_{pp}$ (typically 15-20 volts) on control gate 108, grounding drain 102 by applying high voltage $V_{pp}$ to word line 205 and grounding bit line 210, and grounding source 101 and substrate 99. This causes electrons to tunnel from drain region 102, through tunneling oxide 106, to floating gate 105, which is capacitively coupled to control gate 108. After this programming of the cell to a 34 logical 0, sufficient electrons are stored within floating gate 105 to increase control gate threshold voltage $V_t$ of transistor 100 (typically to greater than 5 volts) such that transistor 100 will not turn on in response to read voltage $V_r$ applied to control gate 108.

Reading of the state of transistor 100 is accomplished by applying operating voltage $V_{cc}$ (typically five volts) to voltage $V_{sense}$ (typically $V_{cc}/2$) to bit line 210, applying read voltage $V_r$ to control gate 108, and grounding source 101 of transistor 100. If a logical 0 is stored in the EEPROM (i.e., floating gate 105 is negatively charged) transistor 100 will not turn on in response to read voltage $V_r$, and no current flows between bit line 210 and source 101 of transistor 100, indicating a logical 0.

In order to erase the EEPROM or, in other words, to change the state of the EEPROM from a logical 0 to a logical 1, floating gate 105 is discharged. This is accomplished, for example, by placing control gate 108 at ground, applying high positive voltage $V_{pp}$ to drain 102 (typically 20 volts) by applying a high voltage to word line 205 and bit line 210, disconnecting source 101 (i.e., source 101 is "floating"), and connecting substrate 99 to ground. This causes electrons to flow from floating gate 105, through tunnel oxide 106, to drain 102, thereby discharging floating gate 105. Discharging floating gate 105 decreases control gate threshold voltage $V_t$, and stores a logical 0 in the memory cell. Applying read voltage $V_r$ to control gate 108 will turn on transistor 100 and current will flow between bit line 210 and source 101 of transistor 100, indicating a logical 1.

Using the structure of FIG. 1a and the circuit of FIG. 1b, programming can also be accomplished by storing a positive charge on floating gate 105. This is done by drawing free electrons from floating gate 105, through tunnel oxide 106, and into drain 102. Erasing is accomplished by drawing electrons back through tunnel oxide 106 from drain 102 and into floating gate 105. Using this method, reading of the cell does not require a voltage to control gate 108 since transistor 100 is already on if floating gate 105 is positively charged (indicating a logical 1) and off if floating gate 105 has no charge (indicating a logical 0). The various voltage levels are shown in Table 2.

TABLE 2

|  | WL | BL | CG | Source | Substrate |
|---|---|---|---|---|---|
| Read | $V_{cc}$ | $V_{sense}$ | ground | ground | ground |
| Write | $V_{pp}$ | $V_{pp}$ | ground | float | ground |
| Erase | $V_{pp}$ | ground | $V_{pp}$ | ground | ground |

The speed of charging floating gate 105 (i.e., programming the cell) and discharging floating gate (i.e., erasing the cell) is determined by the magnitude of the electric field across tunnel oxide 106. This in turn is dependent on the magnitude of voltage $V_{pp}$, which is applied between control gate 108 and drain 102, as well as the coupling ratio of the cell. Coupling ratio defines what portion of the applied voltage $V_{pp}$ appears across tunnel oxide 106 between floating gate 105 and drain 102. For the EEPROM shown in FIG. 1, the voltage $V_f$ between floating gate 105 and drain 102, during programming, may be expressed as a fraction of the programming voltage $V_{pp}$ as follows:

$$V_f = V_{pp} (C_{pp})/(C_{pp} + C_t + C_{ch})$$
or
$$V_f = V_{pp} \times PCR$$

where PCR is the programming coupling ratio. During erasing, control gate 108 and substrate 99 are grounded, and the voltage $V_f$ between floating gate 105 and drain 102 during erasing may be expressed as follows:

$$V_f = V_{pp} (C_{pp} + C_{ch})/(C_{pp} + C_{ch} + C_t)$$
or
$$V_f = V_{pp} \times ECR$$

where ECR is the erasing coupling ratio.

Since it is desirable to provide an EEPROM cell having high programming and erasing speeds, it is desirable to construct the cell such that the programming and erasing coupling ratios are as close to unity as possible. To accomplish this, the value of capacitance $C_t$ should be made as small as possible, capacitance $C_{pp}$ should be as large as possible, and capacitance $C_{ch}$ should be small during programming and large during erasing. Capacitance is calculated using the equation:

$$C = A K \epsilon_0 / t, \text{ where}$$

C is the capacitance
$\epsilon_0$ is the permittivity of empty space ($8.85 \times 10^{-2}$ coul$^2$/newton$^2$-m$^2$)
K is the dielectric constant (3.9 for $SiO_2$)
A is the plate area, and
t is the dielectric thickness.

Limiting factors in reducing $C_t$ are that present technology is only capable of producing plate areas down to a minimum of 1 micron$^2$, and that the thickness of tunnel oxide 106 must be made sufficiently small to allow efficient tunneling to occur between floating gate 105 and drain 102. Capacitance $C_{pp}$ can be increased without limit by reducing dielectric thickness or increasing plate area, thus aiding the efficiency of the cell, however, achieving a consistent thin dielectric thickness over a large area is difficult, and maintaining a small cell size is critical. In the prior art, $C_{ch}$ is not alterable between programming and erasing operations. Thus, there is a tradeoff to be made between reduced cell size versus increased programming and erasing efficiencies. Furthermore, increasing the programming and erasing voltage $V_{pp}$ will increase the speed of programming and erasing the EEPROM cell. However, it is also highly desirable to minimize the programming and erasing voltage $V_{pp}$ to prevent circuit failure due to undesired voltage breakdowns, as well as to avoid the generation of $V_{pp}$ to be unduly burdensome.

Also, manufacturing of prior art EEPROMs involves the relatively complex and time consuming process of forming two separate gates: the floating gate and control gate. Any teaching to eliminate the control gate would reduce cell size, by eliminating contact electrode area, and ease manufacturing complexity and cost. Some prior art EEPROMs, such as that described by R. Cuppens et al. in the article, "An EEPROM for Microprocessors and Custom Logic", IEEE Journal of Solid-State Circuits, Vol. SC-20, No. 2, April 1985, and described by J. Miyamoto et al. in the article, "An Experimental 5-V-Only 256-Kbit CMOS EEPROM with a High Performance Single-Polysilicon Cell", IEEE Journal of Solid-State Circuits, Vol. SC-21, No. 5, October 1986, use a single layer of polycrystalline silicon (poly-Si) to act as a floating gate and use an N+ diffused area to act as a control gate, which is capacitively coupled to the poly-Si layer. This, however, requires extra substrate surface to form the N+ diffused control gate region.

Finally, prior art devices require the word line transistor, such as that shown in FIG. 1b as transistor 200, to operate quickly so reading can be accomplished quickly. Since these word line transistors must be sufficiently large to handle the high programming and erasing voltages, the word line transistors cannot be freely reduced in size for increased speed for reading. One way to decrease the reaction time of the cell is to increase the width of the sense transistor channel. However, this increase in channel width increases capacitance between the floating gate and the substrate, thus, decreasing coupling ratio, and also increases the cell area.

What would be desirable in the industry would be an EEPROM which is simple to manufacture, relatively inexpensive, may be programmed and erased using a lower voltage than prior art EEPROMS, can be read extremely fast, and uses up less chip surface area.

SUMMARY

A single layer of polycrystalline silicon (poly-Si) is used in an EEPROM structure, which obviates the need to form a separate control gate and floating gate. The EEPROM utilizes three separate transistors: a write transistor, a read transistor, and a sense transistor. In the preferred embodiment, the write transistor is an NMOS transistor which has a control gate connected to a word line, the control gate being insulated from a P type channel region by a gate oxide layer. N+ source and drain regions of the write transistor are located at the ends of the channel. When a high positive voltage is applied to the word line, the write transistor turns on. A thin tunnel oxide layer separates the source region of the write transistor from an N doped poly-Si layer and capacitively couples this source region to the poly-Si layer. A relatively thick field oxide layer insulates this poly-Si layer from a substrate region separating the write transistor from the sense transistor. The poly-Si layer extends over the N+ source region of the sense transistor and is capacitively coupled to the source region of the sense transistor via a thin gate oxide insulating layer. This poly-Si layer continues to extend over a channel region separating the N+ source and N+ drain regions of the sense transistor, the poly-Si layer being separated from the channel via the thin gate oxide insulating layer. The drain of the sense transistor also acts as the source of the read transistor, which is also an NMOS transistor. The N+ source and N+ drain of the read transistor are separated by a channel region which conducts when a high positive voltage is applied, via the word line, to a control gate overlying the channel of the read transistor and being insulated from the channel region by the gate oxide layer. In the above structure, the poly-Si layer acts as the floating gate over the channel of the sense transistor.

Since the poly-Si floating gate is both capacitively coupled to the source of the sense transistor and to the source of the write transistor, no separate control gate or control gate electrode is needed (the source of the sense transistor acts as the control gate) and the resulting EEPROM requires less processing steps and less chip area. The structure also enables a higher coupling ratio during erasing, thus allowing faster erase times by coupling a higher voltage onto the poly-Si floating gate. Also, since the read transistor is separate from the write transistor, the read transistor can be made smaller thus allowing faster reading speeds.

DETAILED DESCRIPTION

Figure 2:
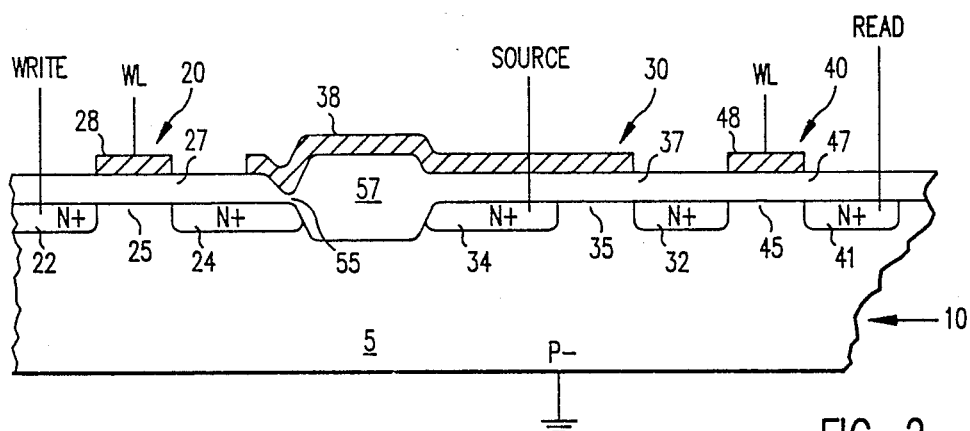
FIG. 2 is a cross-sectional view of an EEPROM, using a single poly-Si layer, in accordance with the preferred embodiment of the invention.

FIG. 2 shows an EEPROM memory cell 10 in accordance with the preferred embodiment of the invention. A P− type substrate 5 has five N+ type regions formed on and below its surface by standard diffusion techniques. These N+ type regions correspond to the source and drain regions of the three transistors which make up the EEPROM memory circuit. Write transistor 20 comprises drain 22, source 24, channel region 25, gate oxide layer 27 and control gate 28. Sense transistor 30 comprises drain 32, source 34, channel region 35, gate oxide layer 37, and N type polycrystalline silicon (poly-Si) floating gate 38. Read transistor 40 comprises drain 41, source 32, which is also the drain of sense transistor 30, channel region 45, gate oxide layer 47, and control gate 48. Poly-Si floating gate 38 is capacitively coupled to source 34 of sense transistor 30, via gate oxide layer 37 (approximately 300 Å in thickness), and capacitively coupled to source 24 of write transistor 20 via tunnel oxide layer 55 (approximately 90 Å in thickness). Poly-Si floating gate 38 also extends over channel region 35 of sense transistor 30 so that when a sufficient positive charge is on poly-Si floating gate 38, channel 35 will invert and conduct current between source 34 and drain 32 of sense transistor 30. Field oxide layer 57 insulates floating gate 38 from the underlying substrate 5 separating sense transistor 30 and write transistor 20.

Figure 3:
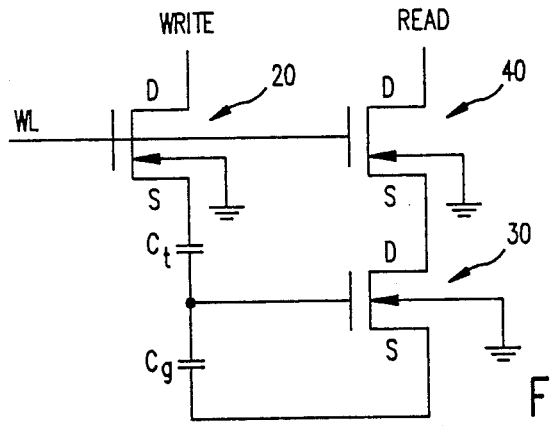
FIG. 3 is a schematic circuit diagram showing the EEPROM of FIG. 2 as three separate transistors.

Operation of the memory cell 10 will be described with reference to FIGS. 2 and 3. In FIG. 3 word line WL is connected to control gates 28 and 48 of write transistor 20 and read transistor 40, respectively. Tunnel oxide layer 55 is represented by capacitor $C_t$ while gate oxide layer 37 between source 34 of sense transistor 30 and poly-Si floating gate 38 is represented by capacitor $C_g$. Drain and source contacts are represented by D and S, respectively.

The three operations of the memory circuit are write, erase, and read. The various voltages applied to the circuit of FIG. 3 is shown in Table 3.

TABLE 3

|  | WL | Write | Read | Source | Substrate |
| --- | --- | --- | --- | --- | --- |
| Read | $V_{cc}$ | ground | $V_{sense}$ | ground | ground |
| Write | $V_{pp}$ | $V_{pp}$ | ground | ground | ground |
| Erase | $V_{pp}$ | ground | $V_{pp}$ | $V_{pp}$ | ground |

When N type poly-Si floating gate 38 is written upon, or programmed, floating gate 38 is given a positive charge by removing free electrons from floating gate 38. To accomplish this, first, a high programming voltage $V_{pp}$ is applied to word line WL, which turns on write and read transistors 20 and 40. By turning on transistor 20, a write signal applied to drain 22 of write transistor 20 is coupled to source 24 of write transistor 20. Similarly, when transistor 40 is on, a read signal applied to drain 41 of read transistor 40 is coupled to source 32 of read transistor 40. Next, in order to program sense transistor 30, high programming voltage $V_{pp}$ is applied to drain 22 of write transistor 20, and source 34 of sense transistor 30, as well as drain 41 of read transistor 40 and substrate 5, is grounded. Since source 24 of write transistor 20 is at a high voltage and source 34 of sense transistor 30 is grounded, voltage is capacitively coupled to poly-Si floating gate 38 due to the electric field created between source 24 and source 34 through gate oxide layer 37 and tunnel oxide layer 55.

Since the capacitance between source 24 and floating gate 38 across tunnel oxide layer 55 is very small (on the order of 0.004 pF), and the capacitance between source 34 and floating gate 38 across gate oxide layer 37 is about ten times greater, a large percentage (on the order of 90%) of the voltage difference between source 24 and source 34 (i.e., $V_{pp}$) appears between source 24 and floating gate 38 across tunnel oxide layer 55. This voltage is sufficient to cause electron tunneling from floating gate 38 to source 24 of write transistor 20 through tunnel oxide layer 55, resulting in a net positive charge on floating gate 38. The positive charge is sufficient to turn on sense transistor 30 because floating gate 38 extends over channel region 35 of sense transistor 30. This indicates a logical 1 since current can flow through sense transistor 30 during a read operation.

To erase floating gate 38, high programming voltage $V_{pp}$ is applied to word line WL as well as source 34 of sense transistor 30 and drain 41 of read transistor 40, while drain 22 of write transistor 20 and substrate 5 are grounded. In this biasing arrangement, the high voltage at source 34 of sense transistor 30 is capacitively coupled to floating gate 38 and almost all of high programming voltage $V_{pp}$ appears across tunnel oxide layer 55 between floating gate 38 and grounded source 24. This causes electrons from source 24 to tunnel through tunnel oxide layer 55, resulting in a net negative charge on floating gate 38. Thus, channel 35 of sense transistor 30 is not inverted and sense transistor 30 is shut off.

When reading the state of sense transistor 30, operating voltage $V_{cc}$, which is less than programming voltage $V_{pp}$, is applied to word line WL, and voltage $V_{sense}$ (usually $V_{cc}/2$) is applied to drain 41 of read transistor 40. Drain 22 of write transistor 20, as well as source 34 of sense transistor 30 and substrate 5, are grounded. A current flows between drain 41 and source 34 if sense transistor 30 is on, indicating a logical 1. If sense transistor 30 is off, current does not flow, indicating a logical 0.

Since sense transistor 30 and read transistor 40 are not subject to high voltage $V_{pp}$ between their source and drain regions, their channel lengths may be made short to increase reading speed.

During the erase operation, source 34 and drain 32 of sense transistor 30 are at a high voltage while substrate 5 is grounded. This drives channel 35 into deep depletion, thus reducing the undesired parasitic capacitance between floating gate 38 and channel 35 and, hence, creating a higher coupling ratio during the erase operation, enabling faster erase times. During the writing operation, both source 34 and channel region 35 are grounded so no undesired parasitic capacitances exist.

Figure 1A:
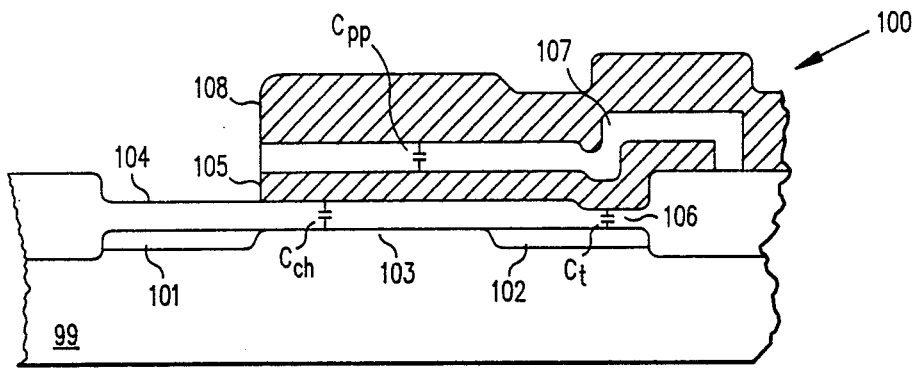
FIG. 1a is a cross-sectional view of a prior art EEPROM memory cell.
Figure 1B:
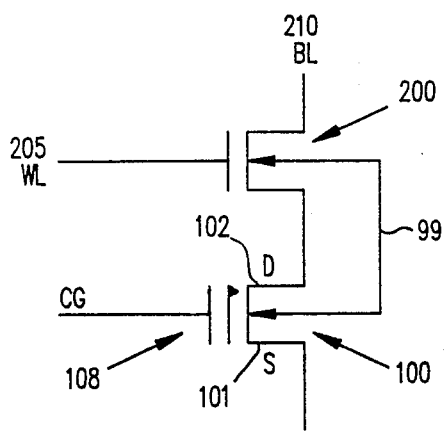
FIG. 1b is a schematic circuit diagram showing the EEPROM cell of FIG. 1a in an EEPROM memory circuit with a word line coupling transistor.

Prior art cells which use a separate control gate above the floating gate, such as that shown in FIG. 1, and apply the voltages shown in Table 2, incur a higher undesired capacitance between the floating gate and the substrate during erasing. This is because, during erasing of the floating gate, the source is floating or at a ground potential to prevent current from flowing through the transistor during erasing, and, consequently, the channel is not driven into deep depletion. To offset this higher capacitance between the floating gate and the substrate, a higher capacitance must be created between the control gate and the floating gate by increasing the area of the control gate. This undesirably increases the size of the EEPROM itself.

Prior art cells such as that shown in FIG. 1 which apply the voltages shown in Table 1, incur a similar undesired capacitance between the floating gate and the substrate, as discussed above, but during the write operation.

Since my memory cell couples a greater voltage to floating gate 38, the tunnel oxide area under tunnel oxide layer 55 may be made smaller than the prior art tunnel oxide area, thus allowing less chance of defects in the formation of the thin tunnel oxide layer. In the preferred embodiment, the tunnel oxide area is approximately 1 micron². Prior art tunnel oxide areas are typically 10-15 microns². Thus, my invention enables an EEPROM to be formed which requires less chip area (approximately 200 microns²) than prior art devices, has faster read times, can be formed with less chance of defects, and can be made with less processing steps than prior art devices requiring a separate control gate.

Figure 4:
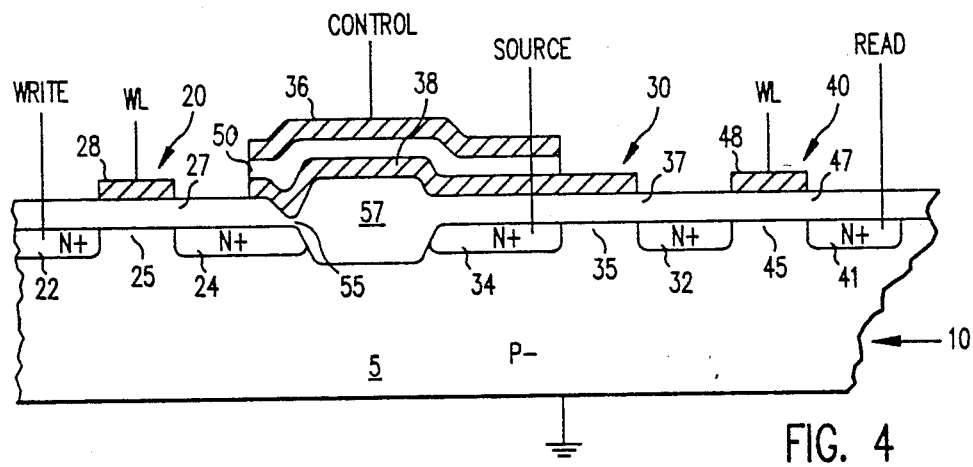
FIG. 4 is a cross-sectional view of an EEPROM in accordance with an alternative embodiment of the invention using two poly-Si layers.

In an alternative embodiment, shown in FIG. 4, the EEPROM of FIG. 2 uses a separate poly-Si control gate 36 to capacitively couple voltage to floating gate 38. Insulating, or coupling, layer 50 insulates control gate 36 and floating gate 38 from each other, and its thickness can be adjusted to obtain the desired capacitance between control gate 36 and floating gate 38. In this configuration, control gate 36 has applied to it the same voltages as the "Source" in Table 3. The added capacitive coupling from control gate 36 increases the coupling ratio during the write and erase operations. During erase, channel 35 is in deep depletion, further increasing the coupling ratio. In this alternative embodiment, coupling layer 50 is 300 Å, with the remainder of the dimensions identical to the preferred embodiment described with reference to FIG. 2.

In another embodiment, almost identical to that of FIG. 4, in which two separate poly-Si layers are used, source 34 is not capacitively coupled to floating gate 38, and the voltage applied to it is irrelevant except during the read operations. However, the same reading, writing, and erasing voltages shown in Table 3 are applied to the remainder of the structure. The control gate has applied to it the same voltages as the "Source" in Table 3. To make negligible the capacitive coupling between source 34 and floating gate 38, a thick insulating layer such as field oxide layer 57, shown in FIG. 4, extends over source 34 and separates source 34 from floating gate 38. In this embodiment, as in the embodiments shown in FIGS. 2 and 4, channel region 35 is in deep depletion during erasing, resulting in an increased coupling ratio and more efficient erasing of the charge on floating gate 38.

Figure 5:
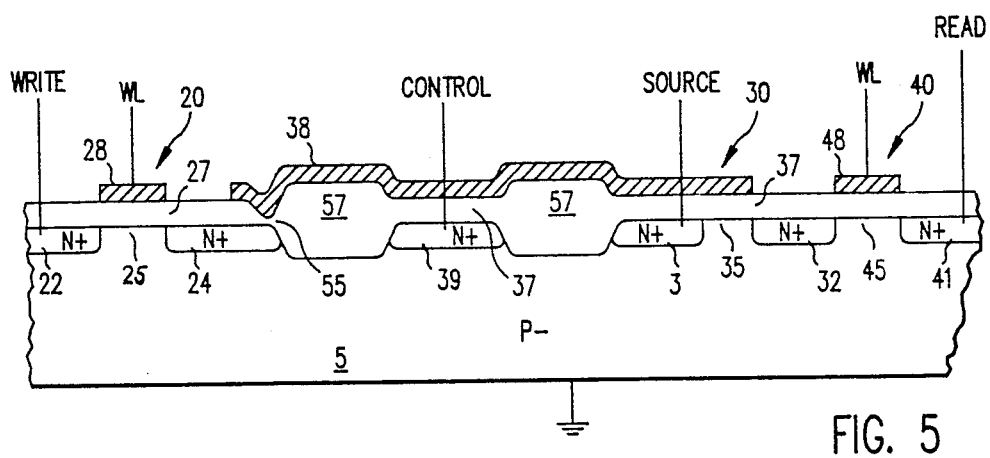
FIG. 5 is a cross-sectional view of an EEPROM in accordance with an alternative embodiment of the invention using a single poly-Si layer with a separate control region.

In another embodiment, shown in FIG. 5, there is a separate N+ diffusion region 39, which acts as a control gate similar to control gate 36 in FIG. 4, to capacitively couple voltage to floating gate 38. Insulating, or coupling, layer 37 insulates control gate 39 from floating gate 38. In this configuration, control gate 39 has applied to it the same voltages as the "Source" in Table 3. As in all embodiments, during erase, channel 35 is in deep depletion, and, thus, there is negligible parasitic capacitance between channel 35 and floating gate 38.

Figure 6:
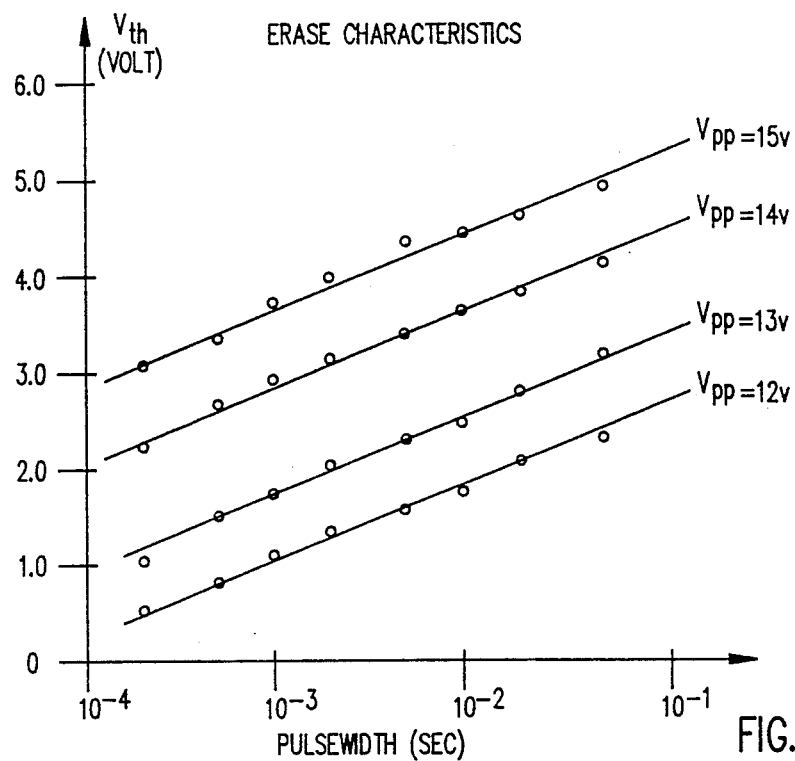
FIG. 6 is a graph showing the voltage threshold of the sense transistor in FIG. 2 given various erase voltages and pulse widths.
Figure 7:
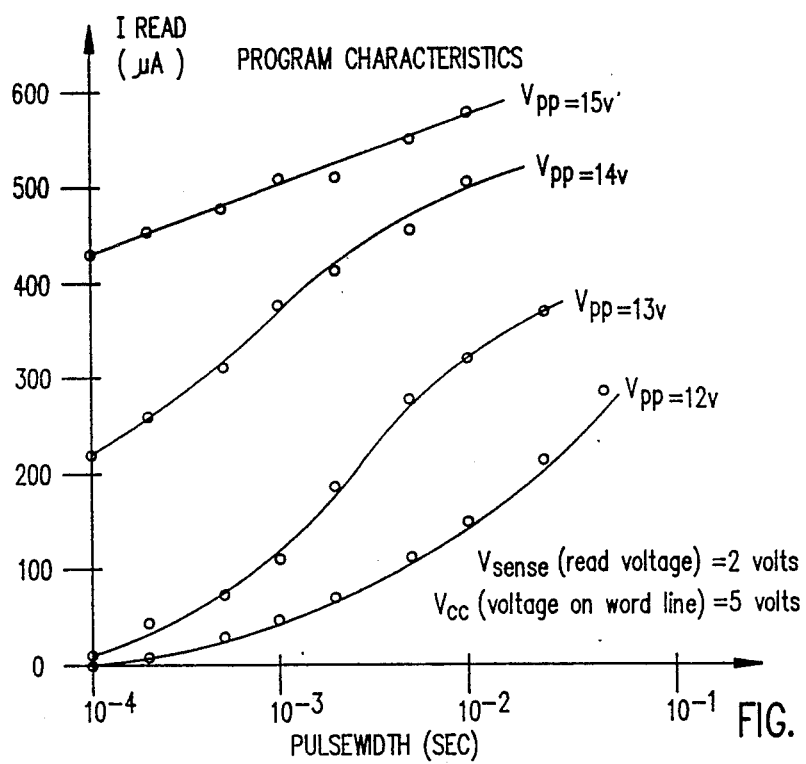
FIG. 7 is a graph showing current through the sense transistor of FIG. 2 given certain programming voltages and pulse widths.

Tests performed on an EEPROM in accordance with the preferred embodiment of FIG. 2 showed that programming and erasing of the EEPROM can be satisfactorily accomplished using a programming and erasing voltage ($V_{pp}$) of 14 volts with a pulse width of about 300 $\mu$s. These results are shown in FIGS. 6 and 7. FIG. 6 shows the resulting threshold voltage of sense transistor 30 when various $V_{pp}$ voltages are applied to the EEPROM at various pulse widths. When the threshold voltage is a positive voltage, sense transistor 30 is off, indicating a logical 0 during the read operation. As seen from FIG. 6, a $V_{pp}$ of 14 volts for 300 $\mu$s, while the EEPROM is biased in the erase mode, will raise the threshold voltage of sense transistor 30 to approximately 2 volts. FIG. 7 shows the current through sense transistor 30, given a read voltage ($V_{sense}$) of 2 volts and a word line voltage ($V_{cc}$) of 5 volts. As seen, a $V_{pp}$ of 14 volts for 300 $\mu$s, while the EEPROM is biased in the programming, or write, mode, will enable a current of approximately 250 $\mu$A to flow through sense transistor 30, indicating that sense transistor 30 is on and, thus, indicating a logical 1.

The preferred and alternative embodiments described are manufactured using well-known techniques, and their method of manufacture will be obvious to those skilled in the art.

This invention is by no means limited to the description of the preferred and alternative embodiments. While the invention has been particularly shown and described with reference to the preferred and alternative embodiments thereof, it will be understood by those skilled in the art that various changes in form and detail may be made therein without departing from the spirit and scope of the invention.

I claim:

1. An EEPROM comprising:
   a semiconductor substrate of a first conductivity type having a ton surface;
   a source/control region of a conductivity type opposite that of said substrate formed on and below said surface of said substrate, said source/control region acting as both a source for a sense transistor and as a control gate for said EEPROM;

a drain region of a conductivity type opposite that of said substrate formed on and below said surface of said substrate;

a third region of a conductivity type opposite that of said substrate formed on and below said surface of said substrate;

a channel region between said source/control and drain regions;

a gate oxide layer formed over said channel region;

a tunnel oxide layer formed over said third region;

a floating gate formed over said channel region, said floating gate being capacitively coupled to said source/control region via said gate oxide layer and capacitively coupled to said third region via said tunnel oxide layer, said gate oxide layer being of a thickness that does not allow electron tunneling to the source/control region, said tunnel oxide layer being of a thickness to allow electron tunneling upon incurrence of a sufficient voltage potential between said floating gate and said third region.

2. An EEPROM comprising:

a semiconductor substrate of a first conductivity type having a top surface;

a first source region of a conductivity type opposite that of said substrate formed on and below said surface of said substrate;

a first drain region of a conductivity type opposite that of said substrate formed on and below said surface of said substrate;

a first channel region between said first source and first drain regions;

a first control gate formed over and insulated from said first channel region—said first source region, first drain region, first channel region, and first control gate forming a write transistor;

a second source region of a conductivity type opposite that of said substrate formed on and below said surface of said substrate;

a second drain region of a conductivity type opposite that of said substrate formed on and below said surface of said substrate;

a second channel region between said second source region and said second drain region;

a gate oxide layer formed over said second channel region and said second source region;

a tunnel oxide layer formed over said first source region of said write transistor;

a floating gate formed over and insulated from said second channel region, said second source region and said first source region, said floating gate being capacitively coupled to said second source region via said gate oxide layer and capacitively coupled to said first source region of said write transistor via said tunnel oxide layer of a thickness to allow electron tunneling upon incurrence of a sufficient voltage potential between said floating gate and said first source region of said write transistor—said second source region, second drain region, second channel region, said gate oxide, and said floating gate forming a sense transistor;

a third source region of a conductivity type opposite that of said substrate formed on and below said surface of said substrate, said third source region also acting as said second drain region of said sense transistor;

a third drain region of a conductivity type opposite that of said substrate formed on and below said surface of said substrate;

a third channel region between said third source region and said third drain region; and a third control gate formed over and insulated from said third channel region—said third source region, said third drain, said third channel region, and third control gate forming a read transistor.

3. An EEPROM comprising:

a semiconductor substrate of a first conductivity type having a top surface;

a first source region of a conductivity type opposite that of said substrate formed on and below surface of said substrate;

a first drain region of a conductivity type opposite that of said substrate formed on and below said surface of said substrate;

a first channel region between said first source and first drain regions;

a first control gate overlying and insulating from said first channel region—said first source region, first drain region, first channel region, and first control gate forming a write transistor;

a second source region of a conductivity type opposite that of said substrate formed on and below said surface of said substrate;

a second drain region of a conductivity type opposite that of said substrate formed on and below said surface of said substrate;

a second channel region between said second source region and said second drain region;

a gate oxide layer formed over said second channel region;

a tunnel oxide layer formed over said first source region of said write transistor;

a floating gate formed over and insulated from said second channel region and said first source region, said floating gate being capacitively coupled to said first source region of said write transistor via said tunnel oxide layer of a thickness to allow electron tunneling upon incurrence of a sufficient voltage potential between said floating gate and said first source region of said write transistor region;

an insulating coupling layer formed over said floating gate;

a second control gate formed over said coupling layer, said second control gate being capacitively coupled to said floating gate via said coupling layer—said second source region, second drain region, second channel region, gate oxide, floating gate, coupling layer, and second control gate forming a sense transistor;

a third source region of a conductivity type opposite that of said substrate formed on and below said surface of said substrate, said third source region also acting as said second drain region of said sense transistor;

a third drain region of a conductivity type opposite that of said substrate formed on and below said surface of said substrate;

a third channel region between said third source region and said third drain region; and a third control gate formed over and insulated from said third channel region, said third source region, third drain region, third channel region, and third control gate forming a read transistor.

4. The EEPROM of claim 3 wherein said floating gate of said sense transistor is also formed over and insulated from said second source region of said sense transistor and capacitively coupled to said second source region via said gate oxide layer.

5. An EEPROM comprising:
- a semiconductor substrate of a first conductivity type having a top surface;
- a first source region of a conductivity type opposite that of said substrate formed on and below said surface of said substrate;
- a first drain region of a conductivity type opposite that of said substrate formed on and below said surface of said substrate;
- a first channel region between said first source and first drain regions;
- a first control gate formed over and insulated from said first channel region—said first source region, first drain region, first channel region, and first control gate forming a write transistor;
- a first control gate region of a conductivity type opposite that of said substrate formed on and below said surface of said substrate;
- a second source region of a conductivity type opposite that of said substrate formed on and below said surface of said substrate;
- a second drain region of a conductivity type opposite that of said substrate formed on and below said surface of said substrate;
- a second channel region between said second source region and said second drain region;
- a gate oxide layer formed over said second channel region and said first control gate region;
- a tunnel oxide layer formed over said first source region of said write transistor;
- a floating gate formed over and insulated from said second channel region, said first control gate region and said first source region, said floating gate being capacitively coupled to said control gate region via said gate oxide layer and capacitively coupled to said first source region of said write transistor via said tunnel oxide layer of a thickness to allow electron tunneling upon incurrence of a sufficient voltage potential between said floating gate and said first source region of said write transistor region—said second source region, second drain region, second channel region, said gate oxide, and said floating gate forming a sense transistor;
- a third source region of a conductivity type opposite that of said substrate formed on and below said surface of said substrate, said third source region also acting as said second drain region of said sense transistor;
- a third drain region of a conductivity type opposite that of said substrate formed on and below said surface of said substrate;
- a third channel region between said third source region and said third drain region; and
- a third control gate formed over and insulated from said third channel region—said third source region, said third drain, said third channel region, and said third control gate forming a read transistor.

6. The EEPROM of claim 5 further characterized in that said gate oxide layer is also formed over said second source region and said second source region is also capacitively coupled to said floating gate.

7. The EEPROM of claim 1, 2, 3, 4, 5, or 6 wherein said first conductivity type is a P type so that during drawing electrons to said floating gate, said second channel region is reverse biased with respect to said second source region and said second drain region, thus creating a deep depletion region in said channel region.

8. The EEPROM of claim 1 wherein said first conductivity is a P type so that during drawing electrons to said floating gate, said channel region is reverse biased with respect to said source/control region and said drain region, thus creating a deep depletion region in said channel region.

* * * * *

UNITED STATES PATENT AND TRADEMARK OFFICE
CERTIFICATE OF CORRECTION

PATENT NO. : 4,924,278

DATED : May 8, 1990

INVENTOR(S) : Stewart Logie

It is certified that error appears in the above-identified patent and that said Letters Patent is hereby corrected as shown below:

Col. 2, line 6, delete "34".

Col. 2, line 14, between "to" and "voltage" insert --word line 205 (turning on transistor 200), applying sense--.

Col. 8, line 63 (Claim 1), change "ton" to --top--.

Signed and Sealed this

Tenth Day of March, 1992

Attest:

HARRY F. MANBECK, JR.

*Attesting Officer*     *Commissioner of Patents and Trademarks*